(12) United States Patent
Tang et al.

(10) Patent No.: US 10,608,077 B2
(45) Date of Patent: Mar. 31, 2020

(54) SEMICONDUCTOR DEVICE FOR HIGH VOLTAGE ISOLATION

(71) Applicant: MOSWAY TECHNOLOGIES LIMITED, Fo Tan, Hong Kong (CN)

(72) Inventors: Chi Keung Tang, Hong Kong (CN); Peter On Bon Chan, Hong Kong (CN)

(73) Assignee: Mosway Technologies Limited, Fo Tan (HK)

( * ) Notice: Subject to any disclaimer, the term of this patent is extended or adjusted under 35 U.S.C. 154(b) by 0 days.

(21) Appl. No.: 16/041,222

(22) Filed: Jul. 20, 2018

(65) Prior Publication Data

US 2020/0027948 A1 Jan. 23, 2020

(51) Int. Cl.
*H01L 29/02* (2006.01)
*H01L 29/06* (2006.01)
*H03K 17/687* (2006.01)
*H01L 29/861* (2006.01)

(52) U.S. Cl.
CPC ........ *H01L 29/0623* (2013.01); *H01L 29/861* (2013.01); *H03K 17/6871* (2013.01)

(58) Field of Classification Search
CPC ....... H01L 29/66681–66704; H01L 29/66613; H01L 29/7816–7826; H01L 21/823462; H01L 21/823842; H01L 29/7812; H01L 29/7824; H01L 21/823857; H01L 27/0922; H01L 27/105; H01L 27/11526; H01L 27/11546; H01L 29/778; H01L 27/14679; H01L 29/66431; H01L 29/66462; H01L 29/66893–66924; H01L 29/7832; H01L 29/8086; H01L 2924/13062; H01L 29/1058; H01L 29/1066; H01L 27/098
See application file for complete search history.

(56) References Cited

U.S. PATENT DOCUMENTS

2009/0212356 A1* 8/2009 Yamada ............. H01L 27/0255
257/328

* cited by examiner

*Primary Examiner* — Cuong B Nguyen
(74) *Attorney, Agent, or Firm* — Leydig, Voit & Mayer, Ltd.

(57) ABSTRACT

A semiconductor device includes a substrate of a first conductivity type with relatively low impurity concentration; a first region of a second conductivity type with relatively low impurity concentration, =located in the substrate; a second region of the first conductivity type with relatively high impurity concentration, located in the substrate; first and second conductors, located on the first region and separated from each other by an isolator layer; and a third conductor, separated from the first and second conductors by the isolator layer, and located on the second region. The first conductor provides a drain terminal. The second conductor provides a source terminal. The third conductor provides a gate terminal.

20 Claims, 9 Drawing Sheets

SEMICONDUCTOR DEVICE FOR HIGH VOLTAGE ISOLATION

TECHNICAL FIELD

The invention relates to a semiconductor device and particularly, although not exclusively, to a semiconductor device arranged to provide high voltage isolation.

BACKGROUND

Conventional high voltage half bridge driver integrated circuit may include a built-in bootstrap diode arranged between the low side supply voltage node VCC and the bootstrap supply voltage node VB, for connection with a bootstrap capacitor (not shown). During normal operation, energy is transferred from the low side power supply with nodes VCC and GND to high side supply decoupling capacitor between nodes VB and VS, via the bootstrap diode. However, in some applications it is preferable to integrate the bootstrap diode in the half-bridge driver integrated circuit for simplifying the application circuit. Such integration requires a diode with high reverse breakdown voltage that is normally not available in typical integrated circuit process technology platforms.

One solution is to use a diode emulator circuit having a high voltage LDMOS device to emulate the function of a diode. But the use of a high voltage LDMOS device usually requires complex eternal circuitry, which is not desirable.

There is a need to provide a simple, low cost solution to the above problems.

SUMMARY OF THE INVENTION

In accordance with a first aspect of the invention, there is provided a semiconductor device, comprising: a substrate of a first conductivity type with relatively low impurity concentration; a first region of a second conductivity type with relatively low impurity concentration arranged on the substrate; a second region of the first conductivity type with relatively high impurity concentration, arranged on the substrate; first and second conductors, arranged on the first region and separated by an isolator layer; and a third conductor, separated from the first and second conductors by the isolator layer, arranged on the second region; wherein the first conductor is arranged to provide a drain terminal, the second conductor is arranged to provide a source terminal, the third conductor is arranged to provide a gate terminal. Preferably, the first conductivity type is P-type and the second conductivity type is N-type. The semiconductor device is preferably a JFET device, in particular, a high voltage JFET device.

Preferably, the second conductor is arranged between the first conductor and the third conductor.

Preferably, the second region forms a diode junction with the first region.

Preferably, the semiconductor device further comprises a third region of the first conductivity type with relatively high impurity concentration, arranged on the substrate; wherein the second region and the third region are arranged on opposite sides of the first region.

Preferably, the third region is region forms a diode junction the first region.

Preferably, the semiconductor device further comprises a buried region of the first conductivity type, arranged between the substrate and the third region. The buried region may have relatively high impurity concentration.

Preferably, the semiconductor device further comprises a fourth region of the second conductivity type with relatively low impurity concentration arranged on the substrate.

Preferably, the semiconductor device further comprises a fourth conductor, separated from the first, second, and third conductors by the isolator layer, arranged on the fourth region.

Preferably, the first and second conductors are arranged between the third conductor and the fourth conductor.

Preferably, the fourth conductor is arranged to be connected to a high-side power supply.

Preferably, the semiconductor device further comprises a buried region of the second conductivity type, arranged between the substrate and the fourth region. The buried region may have relatively high impurity concentration.

Preferably, the semiconductor device further comprises a deep well region of the second conductivity type, arranged between the substrate and the buried region.

Preferably, the semiconductor device further comprises a buried region of the first conductivity type, arranged between the substrate and the second region. The buried region may have relatively high impurity concentration.

Preferably, the buried region is in contact with the second region and forming a diode junction with the first region.

Preferably, the semiconductor device further comprises a buried region of the second conductivity type, arranged between the substrate and the first region. The buried region may have relatively high impurity concentration.

Preferably, the semiconductor device further comprises a deep well region of the second conductivity type, arranged between the substrate and the buried region.

Preferably, the semiconductor device further comprises a fifth region of the first conductivity type, arranged between the first region and the isolator layer.

Preferably, the fifth region is arranged between the first and second conductors in plan view.

In accordance with a second aspect of the invention, there is provided a half-bridge driver comprising the semiconductor device of the first aspect.

In accordance with a third aspect of the invention, there is provided an integrated circuit comprising the semiconductor device of the first aspect.

BRIEF DESCRIPTION OF THE DRAWINGS

Embodiments of the invention will now be described, by way of example, with reference to the accompanying drawings in which.

DETAILED DESCRIPTION OF THE PREFERRED EMBODIMENT

Figure 1:
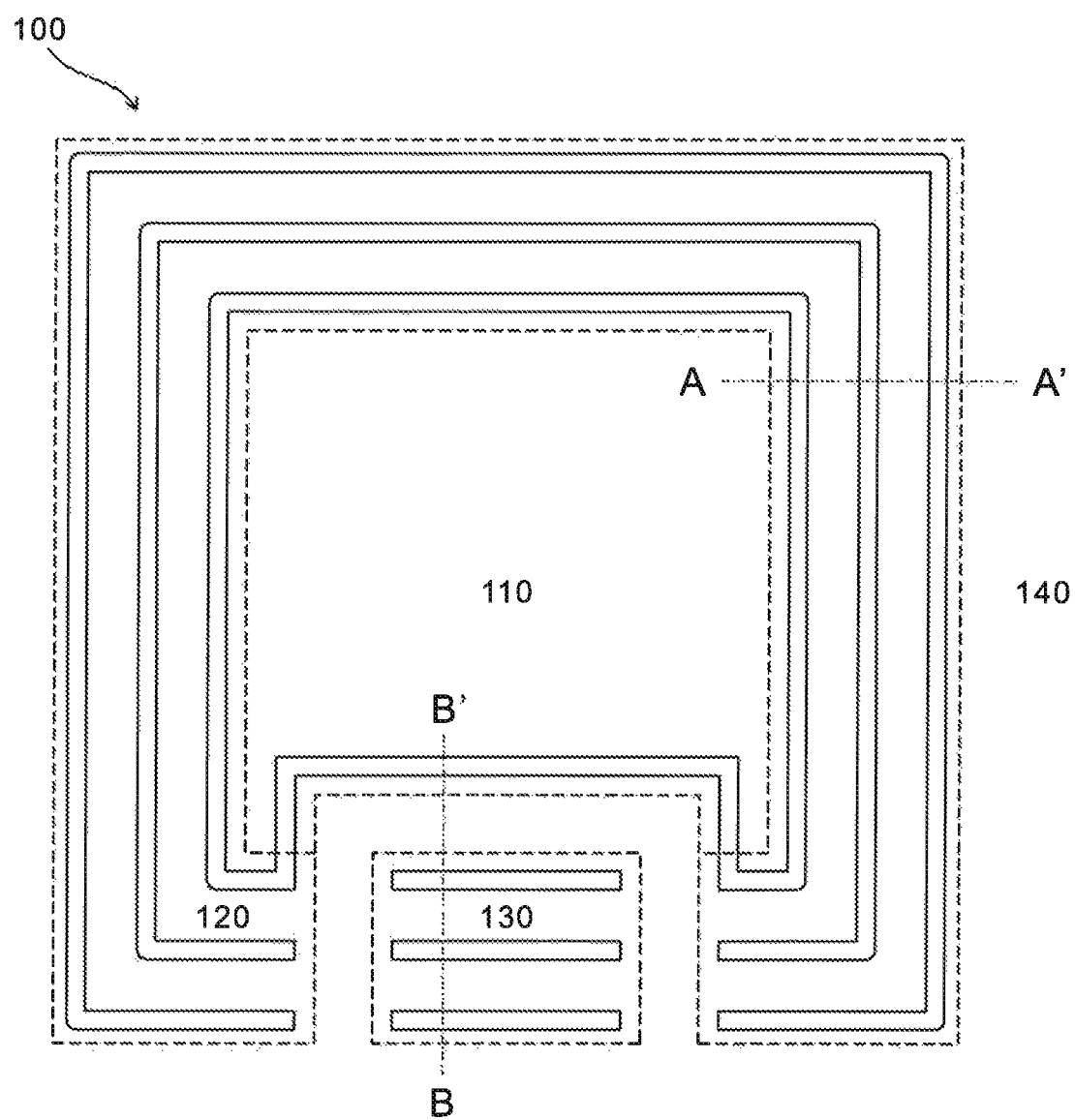
FIG. 1 is a plan view showing the arrangement of semiconductor regions of the semiconductor device in one embodiment of the invention.

FIG. 1 is the topology of a semiconductor device 100 in one embodiment of the invention. In this embodiment, the semiconductor device 100 includes two high voltage junction field effect transistor (JFET) devices. The semiconductor device 100 is arranged to isolate a floating high voltage region 110, such as one in a half bridge driver (not shown), from a low/medium voltage region 140. Regions 120, 130 are respective N− channel regions extending between the respective drains and sources of the two high voltage JFET devices. As shown in FIG. 1, the regions 120 and 130 are spaced from each other and, together, substantially surround the floating high voltage region 110, achieving isolation pf the floating high voltage region 140.

Figure 2:
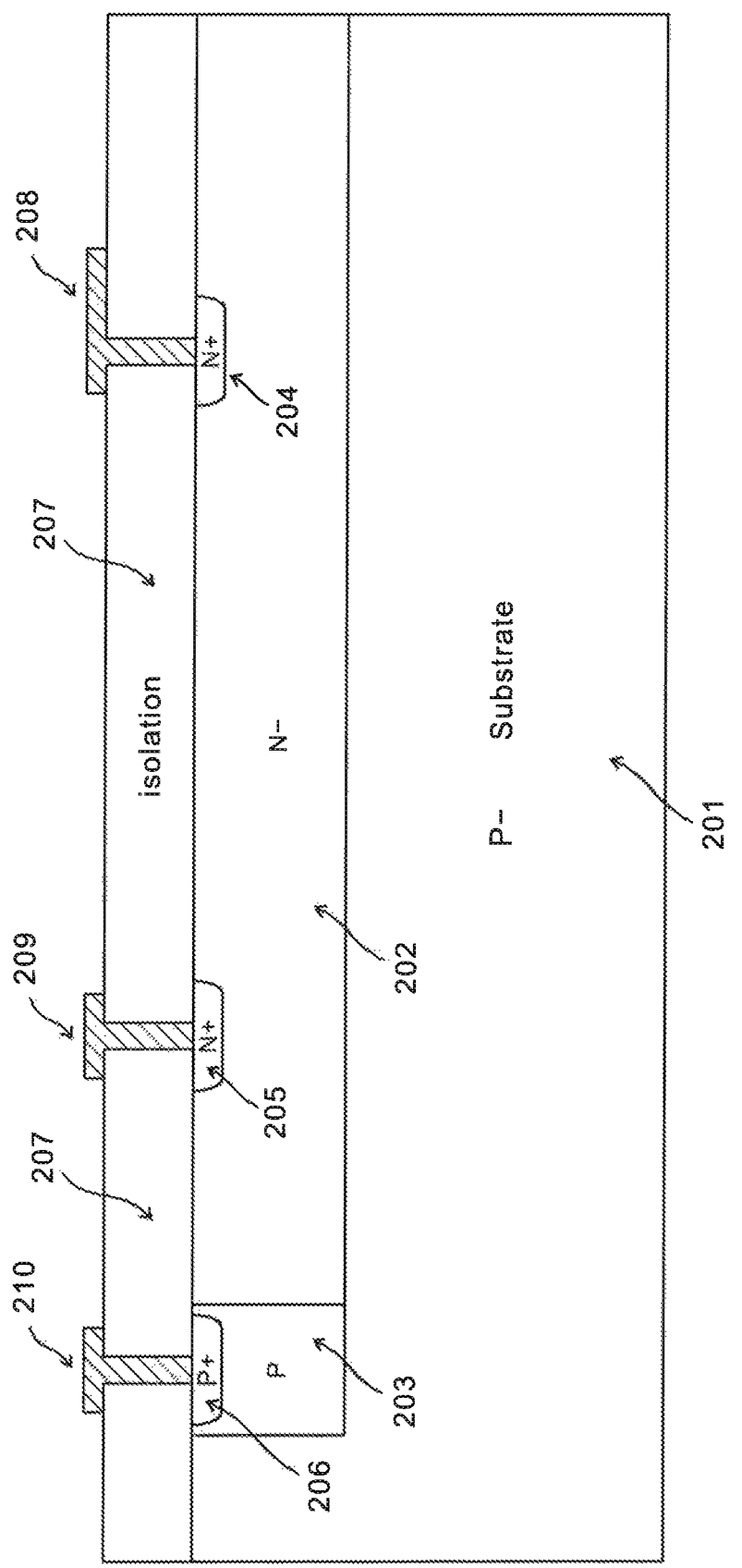
FIG. 2 is a cross sectional view through line A-A' of the semiconductor device of FIG. 1.

FIG. 2 shows the sectional view A-A' of the semiconductor device of FIG. 1. As shown in FIG. 2, a first JFET of the device includes a base P− substrate layer 201. A P diffusion region 203, as the gate region of the first JFET, is arranged on the P− substrate layer 201. A N− region 202, as the channel region of the first JFET, is arranged on the P− substrate layer 201, adjacent to and forming the junction of the first JFET with the P diffusion region 203. A P+ diffusion region 206 is arranged on the P diffusion region 203. A conductor 210, which provides a gate terminal, is arranged on and connected to the P+ diffusion region 206 and is thereby in electrical communication with the gate region 203. Two separate N+ diffusion regions 204, 205, spaced apart, are arranged on the N− region 202. A conductor 209, which provides a source terminal, is arranged on and connected to the N+ diffusion region 205 and is thereby in electrical communication with the channel region 202. A conductor 208, which provides a drain terminal, is arranged on and connected to the N+ diffusion region 204 and is thereby in electrical communication with the channel region 202. The conductors 208, 209 are separated by an electrically insulating isolator layer 207. An electrical current can be made to flow through the N− channel region 202 through the source and drain terminals 209 and 208 via the N+ diffusion regions 204 and 205 without encountering an opposite conductivity type junction, i.e., a diode junction. A depletion region can be formed in the channel region 202 by applying a reverse bias voltage across the opposite conductivity type junction, i.e., diode junction, of the p-type gate region 203 and the N− type channel region 202 through the gate terminal 210, via the P+ diffusion region 206, and the source terminal 209, via the N+ diffusion region 205, to affect a flow of current through the channel region 202 between the source terminal 209 and the drain terminal 208. The conductors 208-210 are metallic. The drain terminal is arranged to be connected to a high side power supply.

Figure 3:
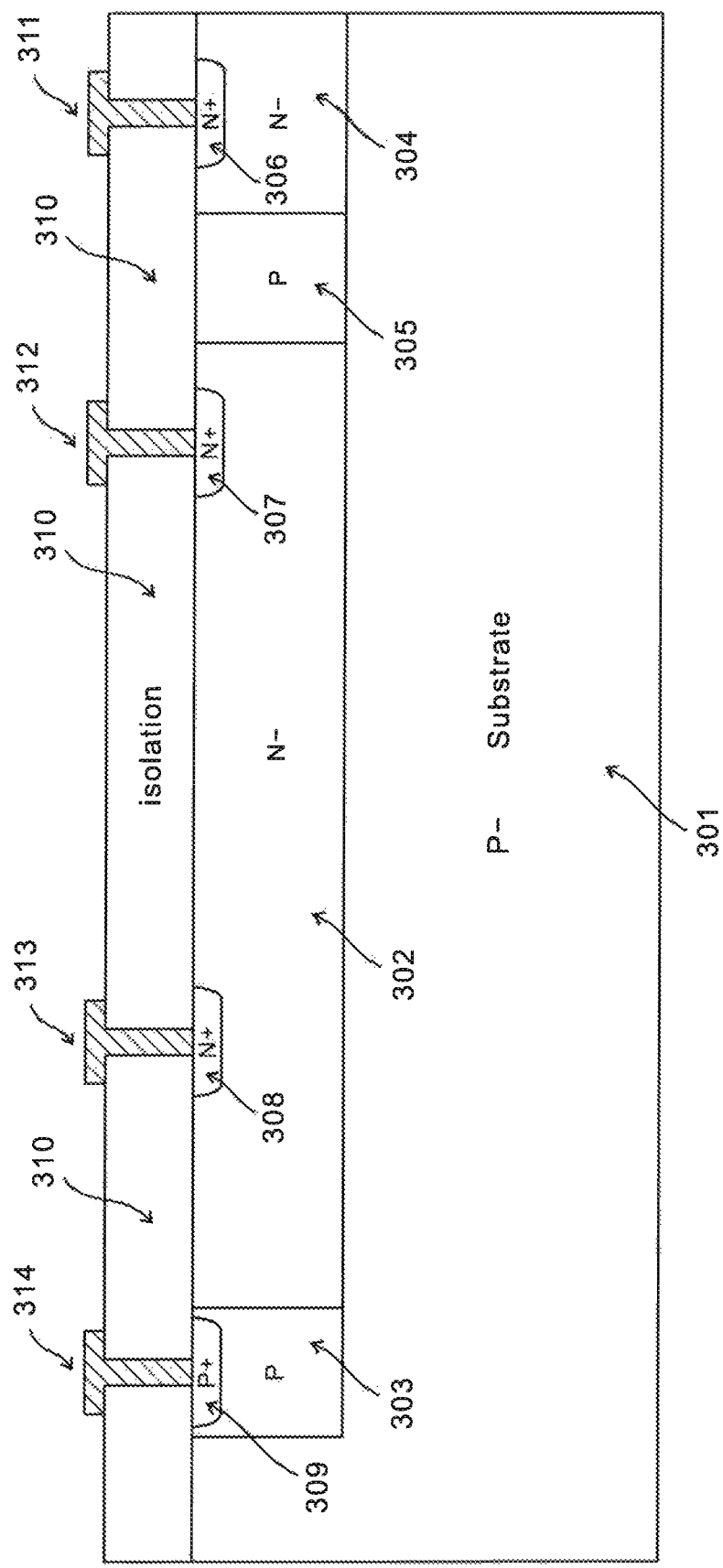
FIG. 3 is a cross sectional view through line B-B' of the semiconductor device of FIG. 1.

FIG. 3 shows the sectional view B-B' of the semiconductor device of FIG. 1. As shown in FIG. 3, a second JFET of the device includes a base P− substrate layer 301. A P diffusion region 303, as the gate region of the second JFET, is arranged on the P− substrate layer 301, in direct contact with an N− region 302, forming the junction of the second JFET. The N− region 302, as the channel region of the second JFET, is arranged on the P− substrate layer 301, adjacent the P diffusion region 303. Another P diffusion region 305 is arranged on the P− substrate layer 301, on another side of the N− region 302. Another N− region 304 is arranged on the P− substrate layer 301, adjacent the P diffusion region 305, on the side opposite the N− region 302. A P+ diffusion region 309 is arranged on the P diffusion region 303. A conductor 314 provides a gate terminal which is connected to the P+ diffusion region 309 and is thereby in electrical communication with the gate region 303. Two N+ diffusion regions 307, 308, spaced apart, are arranged on the N− region 302. A conductor 313, which provides a source terminal, is arranged on and connected to the N+ diffusion region 308 and is thereby in electrical communication with the channel region 302. A conductor 312, which provides a drain terminal, is connected to the N+ diffusion region 307 and is thereby in electrical communication with the channel region 302. The conductors 312, 313 are separated by an electrically insulating isolator layer 310. An electrical current can be made to flow through the N− channel region 302 through the source and drain terminals 313 and 312 via the P+ diffusion regions 307 and 308 without encountering an opposite conductivity type junction, i.e., diode junction. A depletion region can be formed in the N− channel region 302 by applying a reverse bias voltage across the opposite conductivity type junction, i.e., diode junction, of the P-type gate region 303 and the N− channel region 302 through the gate terminal 314, via the P+ diffusion region 309, and the source terminal 313, via the N+ diffusion region 308, to affect a flow of current through the channel region 302 between the source terminal 313 and the drain terminal 312. The conductors, 311-314 are separated by the isolator layer 310. The conductors 311-314 are metallic. Conductor 311 is arranged to be connected to a high side power supply.

Figure 4:
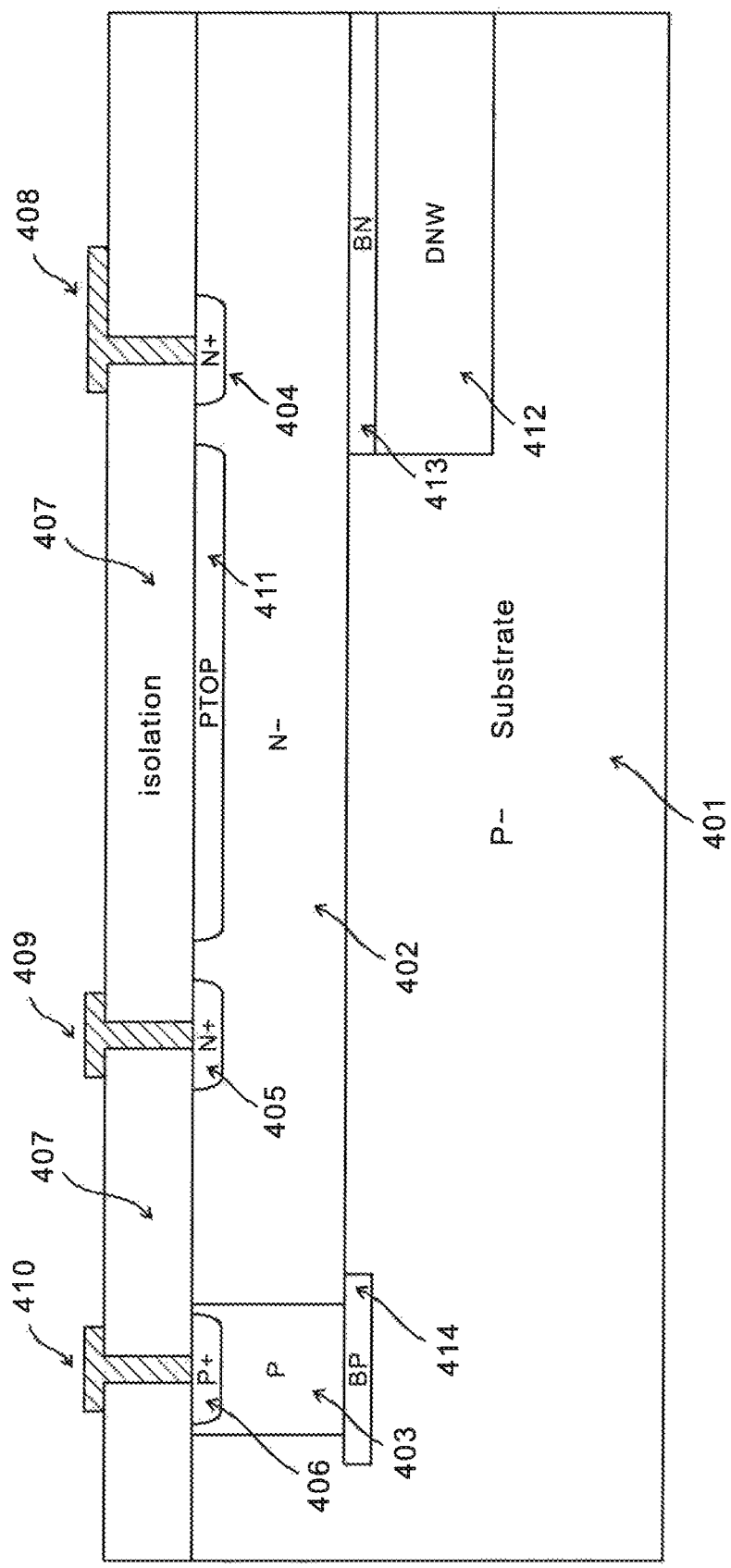
FIG. 4 is an alternative embodiment of FIG. 2.

FIG. 4 is a variation of the embodiment of FIG. 2. Only the difference will be described. In FIG. 4, a PTOP region 411 is arranged between the N-region 402 and the isolator layer 407. The PTOP region 411 is arranged between the separate N+ diffusion regions 404, 405 in plan view. The PTOP region 411 is arranged to improve control pinch off of the semiconductor device. An additional buried P region 414 is arranged between the P diffusion region 403 and the P-substrate 401. The buried P region 414 contacts the P diffusion region 403, the P-substrate 401, as well as forming a diode junction with the N-region 402. Additionally, an upper buried N region 413 and a lower deep N well 412 are arranged between the N-region 412 and the P-substrate 401, below the conductor 408. These buried layers help to improve the breakdown voltage of the device.

Figure 5:
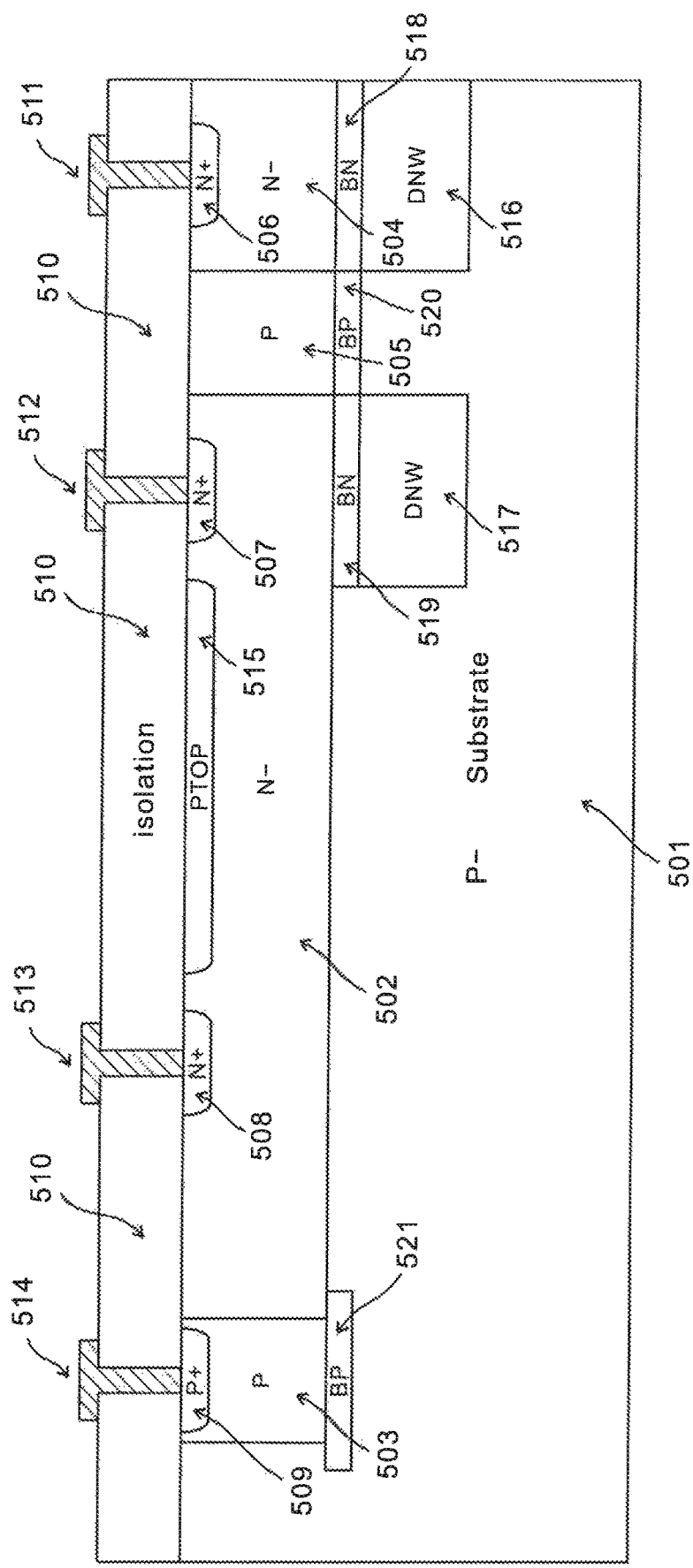
FIG. 5 is an alternative embodiment of FIG. 3.

FIG. 5 is a variation of the embodiment of the second JFET that is shown in FIG. 3. Only the difference will be described. In FIG. 5, a PTOP region 515 is arranged between the N− region 502 and the isolator layer 510. The PTOP region 515 is arranged between the separate N+ diffusion regions 507, 508 in plan view. The PTOP region 515 is arranged to improve control pinch off of the semiconductor device. An additional buried P region 521 is arranged between the P diffusion region 503 and the P− substrate 501. The buried P region 521 contacts the P diffusion region 503, the P− substrate 501, as well as forming a diode junction with the N− region 502. Additionally, an upper buried N region 519 and a lower deep N well 517 are arranged between the N− region 502 and the P− substrate 501, below the conductor 512. A further buried P region 520 is arranged between the P region 505 and the P− substrate 501. Additionally, an upper buried N region 518 and a lower deep N well 516 are arranged between the N− region 504 and the P− substrate 501, below the conductor 511. These buried layers help to improve the breakdown voltage of the device.

Figure 6:
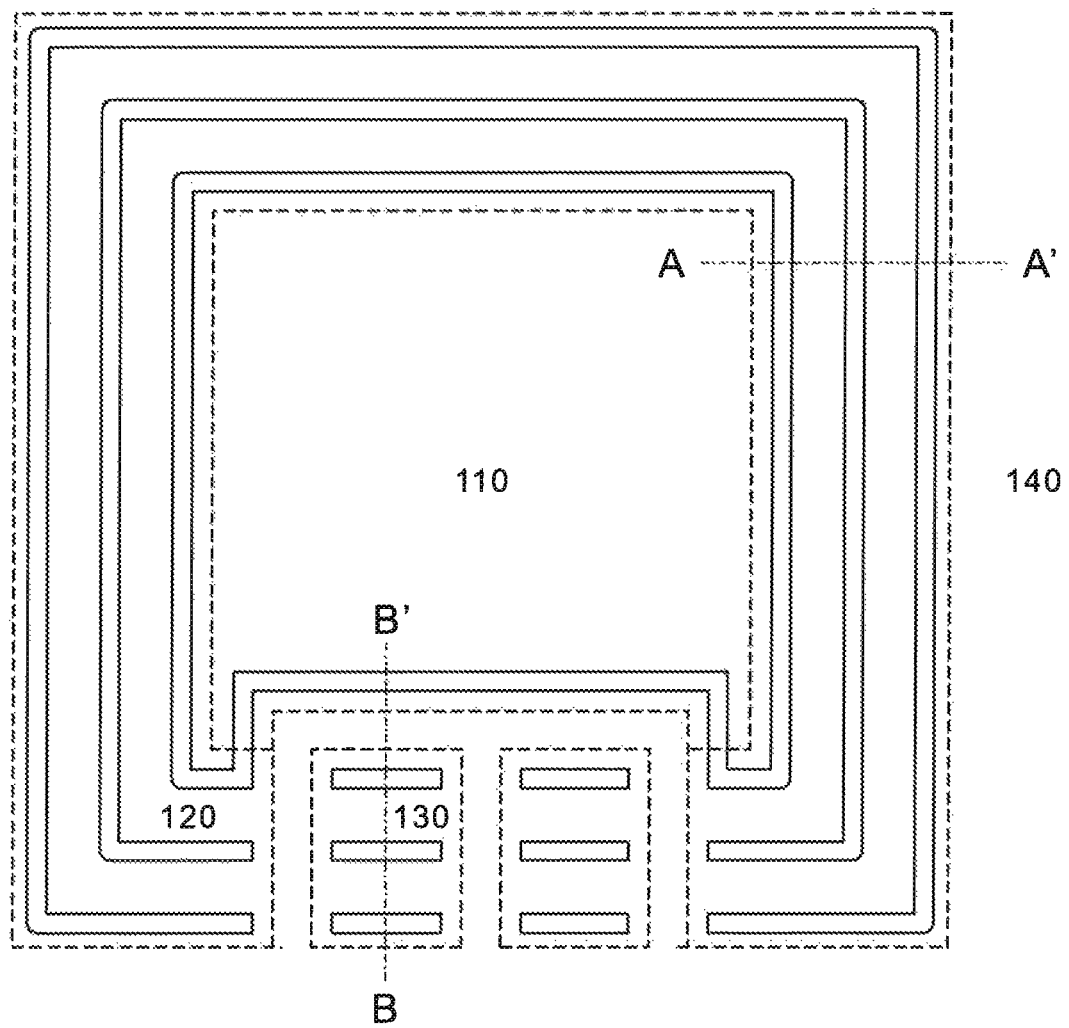
FIG. 6 is a plan view showing the arrangement of semiconductor regions of the semiconductor device in one embodiment of the invention.

FIG. 6 shows an alternative arrangement of semiconductor regions of the semiconductor device in one embodiment of the invention. The sectional views in FIGS. 2-5 also apply to this embodiment of FIG. 6.

Figure 7:
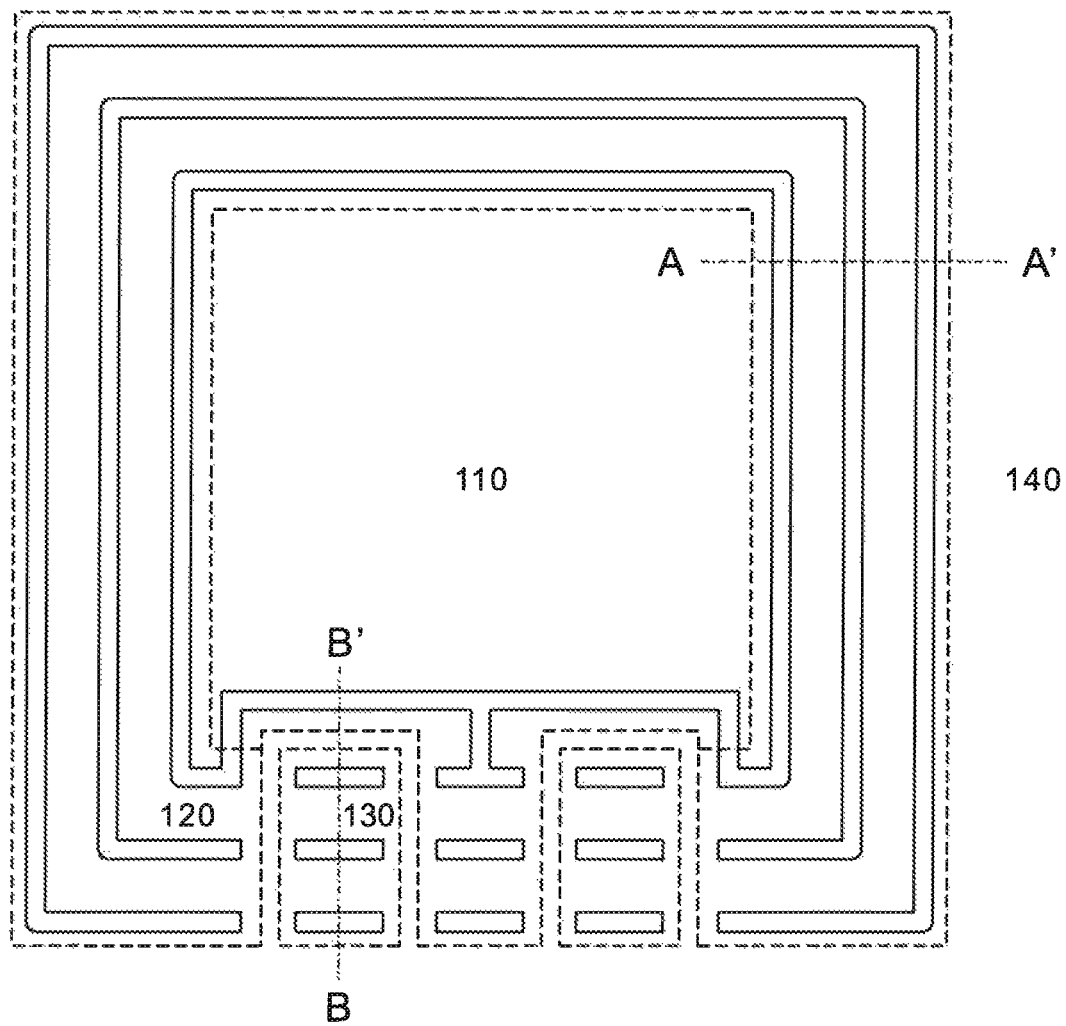
FIG. 7 is a plan view showing the arrangement of semiconductor regions of the semiconductor device in one embodiment of the invention.

FIG. 7 shows an alternative arrangement of semiconductor regions of the semiconductor device in one embodiment of the invention. The sectional views in FIGS. 2-5 also apply to this embodiment of FIG. 7.

Figure 8:
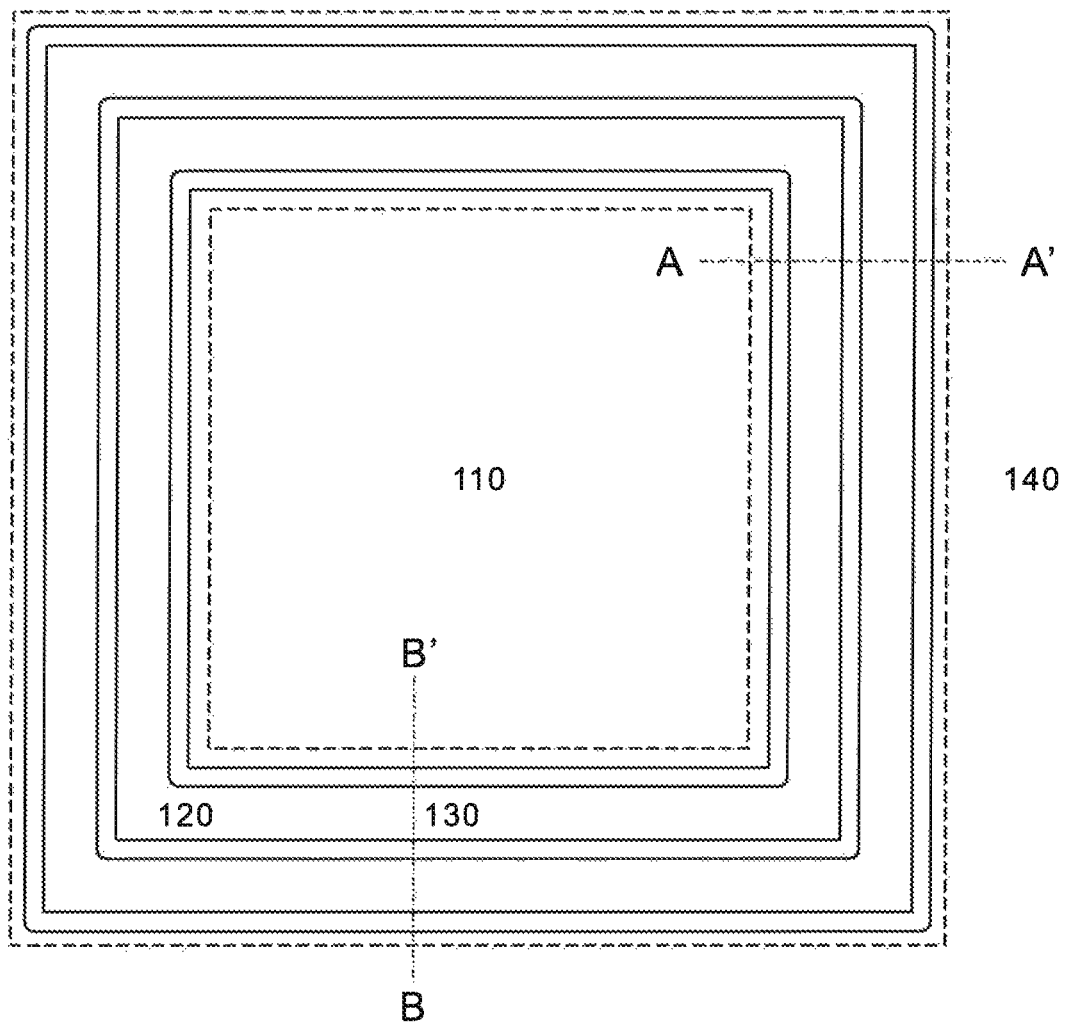
FIG. 8 is a plan view showing the arrangement of semiconductor regions of the semiconductor device in one embodiment of the invention.

FIG. 8 shows an alternative arrangement of semiconductor regions of the semiconductor device in one embodiment of the invention. In this embodiment, the section B-B', unlike the other embodiments, is the section A-A'. In other words, the sectional views in FIGS. 2 and 4 apply to both A-A' and B-B' in FIG. 8.

Figure 9:
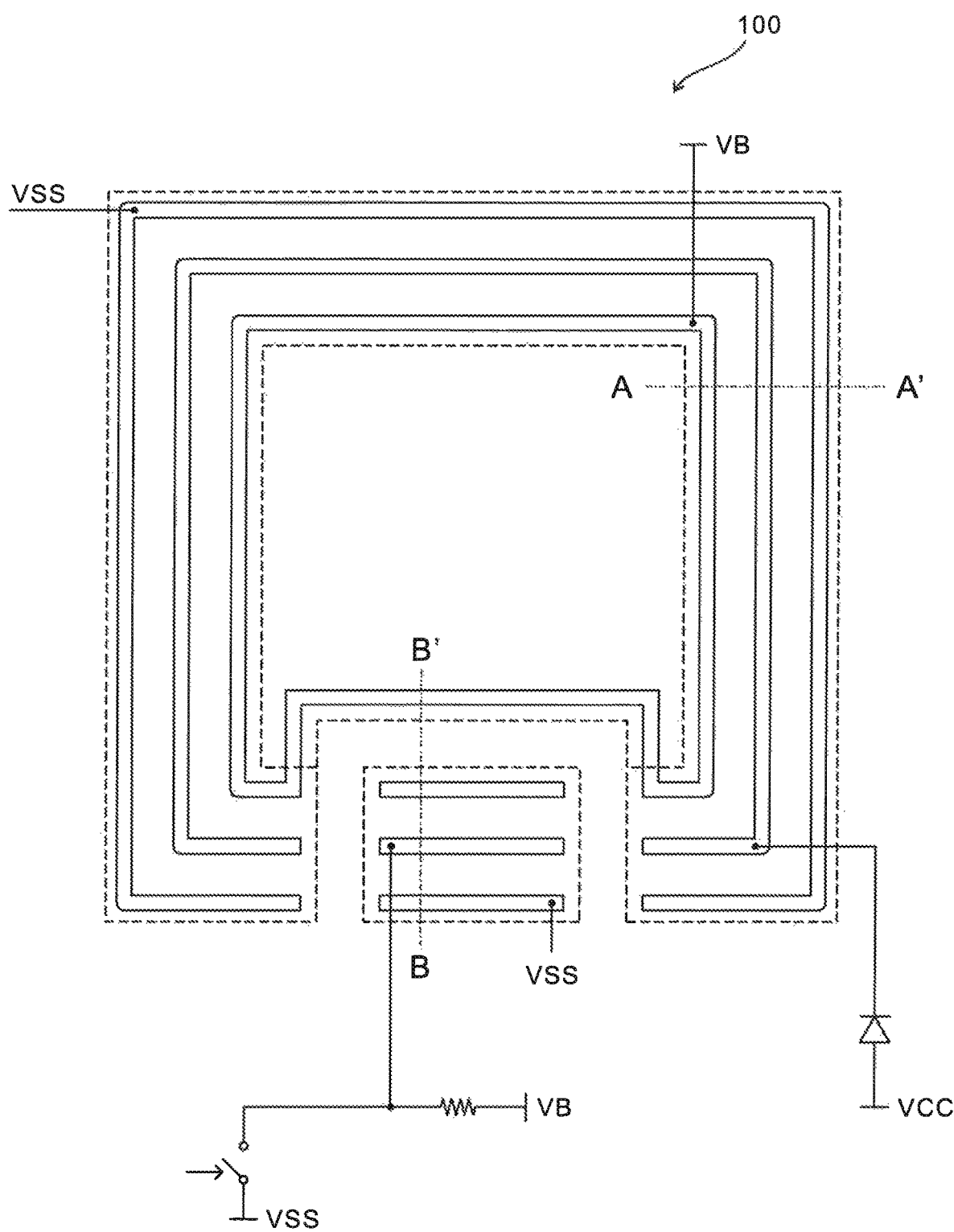
FIG. 9 is a schematic diagram showing an application of the semiconductor device of FIG. 1.

FIG. 9 illustrate exemplary applications (multiple applications drawn on the same drawing) of the semiconductor device 100 of the above embodiments. In one application, the device 100 can be used as an isolation structure between the floating high voltage region and the low/medium voltage region. In another application, the device 100 can be used as part of bootstrap diode. For example, connecting a medium voltage diode or an emulated diode in series with the device 100, such as the part in FIG. 2, may provide a bootstrap diode. In yet another application, by connecting an additional medium voltage switching device between the source terminal of the device (such as the part in FIG. 3) and voltage VSS of the low/medium voltage region, connecting a resistor between the drain terminal of the device and the high side power supply, and using a control signal to control the medium voltage switching device at low/medium voltage region, the resulting circuit can be used as level shifter circuit to pass control signal from low/medium voltage region to floating high voltage region.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

For example, the semiconductor device in the invention may include one or more additional PTOP layer to further improve pinch off control. The semiconductor device in the invention may include, additionally, or alternatively, one or more deep N well, one or more additional buried layers (N or P), etc., at strategic locations for improving the breakdown performance. FIGS. 4 and 5 show one example when various modifications are made but it should be noted that the invention covers variations based on one or more changes. The conductivity of the device may be reversed, meaning that P may become N, and vice versa.

The invention claimed is:

1. A dual junction field effect transistor (JFET) semiconductor device comprising:
a first JFET and a second JFET, wherein
each of the first and second JFETs includes a respective gate region and channel region of opposite conductivity types and forming a diode junction, a drain terminal, a source terminal, and a gate terminal,
the first JFET includes
a substrate layer of a first conductivity type with a relatively low impurity concentration,
a first region of a second conductivity type and having a relatively low impurity concentration, located in the substrate layer as the channel region of the first JFET,
first and second conductors located on and in electrical communication with the first region and separated from each other by an electrically insulating isolator layer, wherein the first conductor is the drain terminal of the first JFET and the second conductor is the source terminal of the first JFET for establishing an electrical current can flow between the source terminal and the drain terminal and through the first region without encountering an opposite conductivity type junction,
a second region of the first conductivity type and having a relatively high impurity concentration, located in the substrate layer and contacting the first region to form the diode junction of the first JFET, and
a third conductor, separated from the first and second conductors by the isolator layer, arranged on and in electrical communication with the second region, wherein the third conductor is the gate terminal of the first JFET for establishing a depletion region in the first region and thereby controlling the electrical current flow through the first region, between the source terminal and the drain terminal of the first JFET, and
the second JFET includes
a substrate layer of a first conductivity type with a relatively low impurity concentration,
a first region of the second conductivity type and having a relatively low impurity concentration, located in the substrate layer as the channel region of the second JFET,
first and second conductors located on and in electrical communication with the first region and separated from each other by an electrically insulating isolator layer, wherein the first conductor is the drain terminal of the second JFET and the second conductor is the source terminal of the second JFET for establishing an electrical current can flow between the source terminal and the drain terminal and through the first region without encountering an opposite conductivity type junction,
a second region of the first conductivity type and having a relatively high impurity concentration, located in the substrate layer and contacting the first region to form the diode junction of the second JFET, and
a third conductor, separated from the first and second conductors by the isolator layer, arranged on and in electrical communication with the second region, wherein the third conductor is the gate terminal of the second JFET for establishing a depletion region in the first region and thereby controlling the electrical current flow through the first region, between the source terminal and the drain terminal of the second JFET.

2. The dual JFET semiconductor device of claim 1, wherein
the second conductor of the first JFET is located between the first conductor and the third conductor of the first JFET, and
the second conductor of the second JFET is located between the first conductor and the third conductor of the second JFET.

3. The dual JFET semiconductor device of claim 1, wherein
the second JFET further comprises a third region of the first conductivity type and having a relatively high impurity concentration, located in the substrate, and the second region of the second JFET and the third region are located on opposite sides of the first region of the second JFET.

4. The dual JFET semiconductor device of claim 3, wherein the third region forms a diode junction with the first region of the second JFET.

5. The dual JFET semiconductor device of claim 3, wherein the second JFET further comprises a buried region of the first conductivity type, located between the substrate and the third region of the second JFET.

6. The dual JFET semiconductor device of claim 1, wherein the second JFET further comprises a third region of the second conductivity type and having a relatively low impurity concentration, located in the substrate.

7. The dual JFET semiconductor device of claim 6, wherein the second JFET further comprises a fourth conductor, separated from the first, second, and third conductors of the second JFET by the isolator layer and located on and in electrical communication with the third region of the second JFET.

8. The dual JFET semiconductor device of claim 7, wherein the first and second conductors of the second JFET are located between the third conductor and the fourth conductor of the second JFET.

9. The dual JFET semiconductor device of claim 7, wherein the fourth conductor is arranged to be connected to a high-side power supply.

10. The dual JFET semiconductor device of claim 7, wherein the second JFET further comprises a buried region of the second conductivity type, located between the substrate and the third region.

11. The dual JFET semiconductor device of claim 10, wherein the second JFET further comprises a deep well region of the second conductivity type, located between the substrate and the buried region.

12. The dual JFET semiconductor device of claim 1, wherein the second JFET further comprises a buried region of the first conductivity type, located between the substrate and the second region of the second JFET.

13. The dual JFET semiconductor device of claim 12, wherein the buried region is in contact with the second region of the second JFET and forms a diode junction with the first region of the second JFET.

14. The dual JFET semiconductor device of claim 1, wherein the second JFET further comprises a buried region of the second conductivity type, located between the substrate and the first region of the second JFET.

15. The dual JFET semiconductor device of claim 14, wherein the second JFET further comprises a deep well region of the second conductivity type, located between the substrate and the buried region.

16. The dual JFET semiconductor device of claim 1, wherein the second JFET further comprises a third region of the first conductivity type located between the first region of the second JFET and the isolator layer.

17. The dual JFET semiconductor device of claim 16, wherein the third region is located between the first and second conductors of the second JFET in a plan view of the substrate.

18. A half-bridge driver comprising the dual JFET semiconductor device of claim 1.

19. An integrated circuit comprising the dual JFET semiconductor device of claim 1.

20. The dual JFET semiconductor device of claim 1 including a floating high voltage region, wherein, in a plan view of the dual JFET semiconductor device,
the first region of the first JFET is spaced from the first region of the second JFET, and
the first region of the first JFET and the first region of the second JFET, in combination, substantially surround and isolate the floating high voltage region.

* * * * *